United States Patent
Cho et al.

(10) Patent No.: US 7,902,880 B2
(45) Date of Patent: Mar. 8, 2011

(54) TRANSITIONING DIGITAL INTEGRATED CIRCUIT FROM STANDBY MODE TO ACTIVE MODE VIA BACKGATE CHARGE TRANSFER

(75) Inventors: Choongyeun Cho, Hopewell Junction, NY (US); Daeik Kim, Beacon, NY (US); Jonghae Kim, Fishkill, NY (US); Moon Ju Kim, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/844,339

(22) Filed: Jul. 27, 2010

(65) Prior Publication Data
US 2010/0285616 A1   Nov. 11, 2010

Related U.S. Application Data

(62) Division of application No. 12/206,124, filed on Sep. 8, 2008, now Pat. No. 7,791,403.

(51) Int. Cl.
*H01L 25/00* (2006.01)
*H03K 19/00* (2006.01)

(52) U.S. Cl. ............. 326/102; 327/535; 326/33; 361/55; 361/56; 438/129

(58) Field of Classification Search ............ 438/129; 326/31, 33, 101–103; 327/534–535; 361/54–56
See application file for complete search history.

(56) References Cited

U.S. PATENT DOCUMENTS

| | | | |
|---|---|---|---|
| 5,610,533 A * | 3/1997 | Arimoto et al. | 326/33 |
| 5,726,946 A | 3/1998 | Yamagata et al. | |
| 5,814,899 A * | 9/1998 | Okumura et al. | 307/64 |
| 5,838,047 A * | 11/1998 | Yamauchi et al. | 257/372 |
| 5,892,260 A * | 4/1999 | Okumura et al. | 257/347 |
| 6,111,455 A * | 8/2000 | Eleyan et al. | 327/537 |
| 6,404,269 B1 * | 6/2002 | Voldman | 327/534 |
| 6,628,159 B2 * | 9/2003 | Voldman | 327/534 |
| 6,643,208 B2 | 11/2003 | Yamagata et al. | |
| 7,176,749 B2 | 2/2007 | Sharma et al. | |

(Continued)

OTHER PUBLICATIONS

Office Action for U.S. Appl. No. 12/206,124 (U.S. Patent Publication No. 2010/0060344 A1), dated Dec. 7, 2009. Ishihara et al., "An Architectural Level Energy Reduction Technique for Deep-Submicron Cache Memories", IEEE Computer Society, Proceedings of the 15th International Conference on VLSI Design (VLSID'02), Mar. 2002.

(Continued)

*Primary Examiner* — James H. Cho
*Assistant Examiner* — Jason M Crawford
(74) *Attorney, Agent, or Firm* — William E. Schiesser; Kevin P. Radigan, Esq.; Heslin Rothenberg Farley & Mesiti P.C.

(57) ABSTRACT

Circuits and methods are provided for facilitating transitioning of a digital circuit from backgate biased standby mode to active mode. The digital circuit includes a semiconductor substrate, multiple n-channel transistors disposed at least partially in one or more p-type wells in the semiconductor substrate, multiple p-channel transistors disposed at least partially in one or more n-type wells in the semiconductor substrate, and a backgate control circuit. The backgate control circuit is electrically coupled to the p-type well(s) and to the n-type well(s) to facilitate transitioning of the multiple n-channel transistors and the multiple p-channel transistors from backgate biased standby mode to active mode by automatically shunting charge from the n-type well(s) to the p-type well(s) until a well voltage threshold is reached indicative of a completed transition of the transistors from backgate biased standby mode to active mode.

8 Claims, 8 Drawing Sheets

U.S. PATENT DOCUMENTS

| | | |
|---|---|---|
| 7,312,640 B2 | 12/2007 | Horiguchi et al. |
| 2001/0052623 A1 | 12/2001 | Kameyama et al. |
| 2003/0080782 A1 | 5/2003 | Bailey et al. |
| 2003/0218494 A1 | 11/2003 | Kubo et al. |
| 2010/0060344 A1 | 3/2010 | Cho et al. |

OTHER PUBLICATIONS

Kalla et al., "LRU-SEQ: A Novel Replacement Policy for Transition Energy Reduction in Instruction Caches", Proceedings of the International Conference on Computer Aided Design (ICCAD'03), 2003.

* cited by examiner

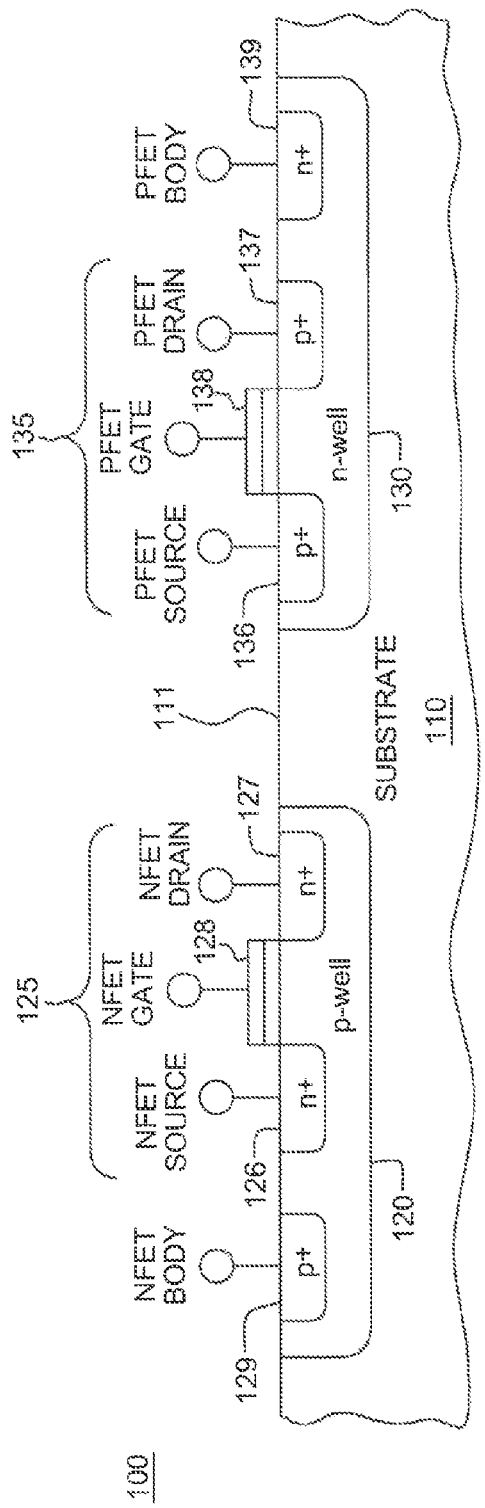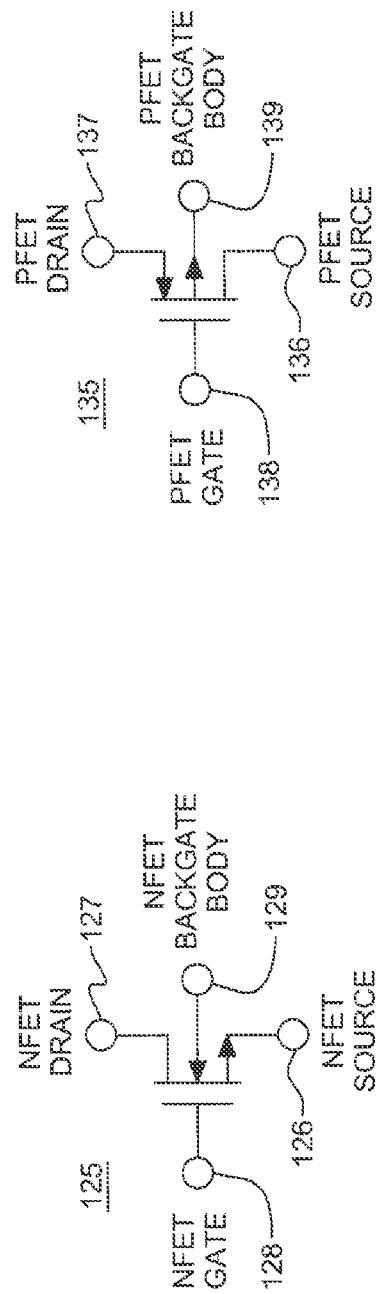

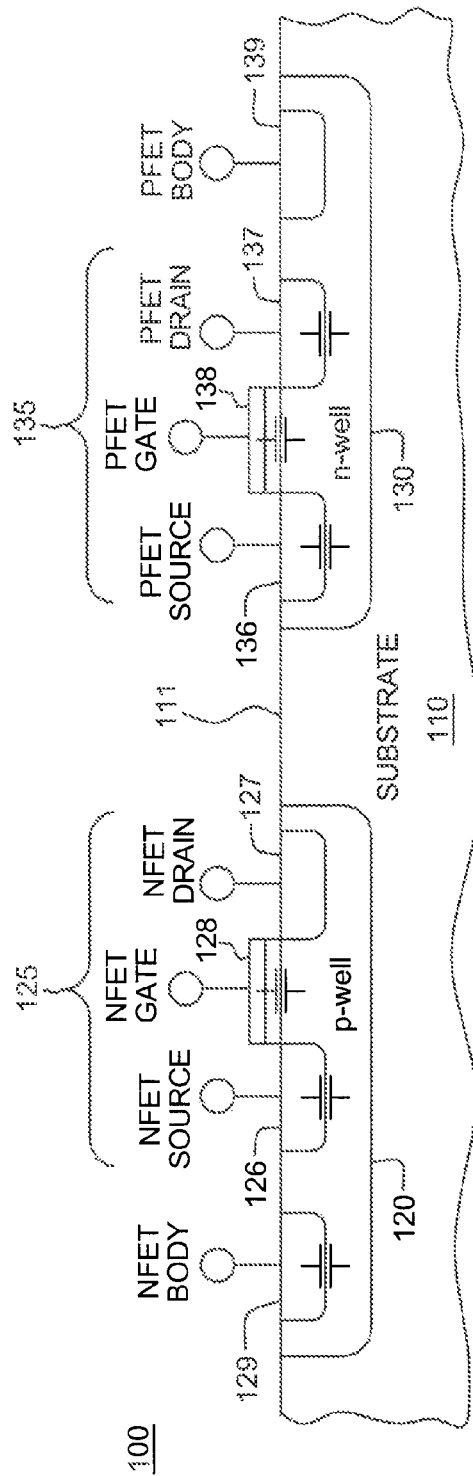
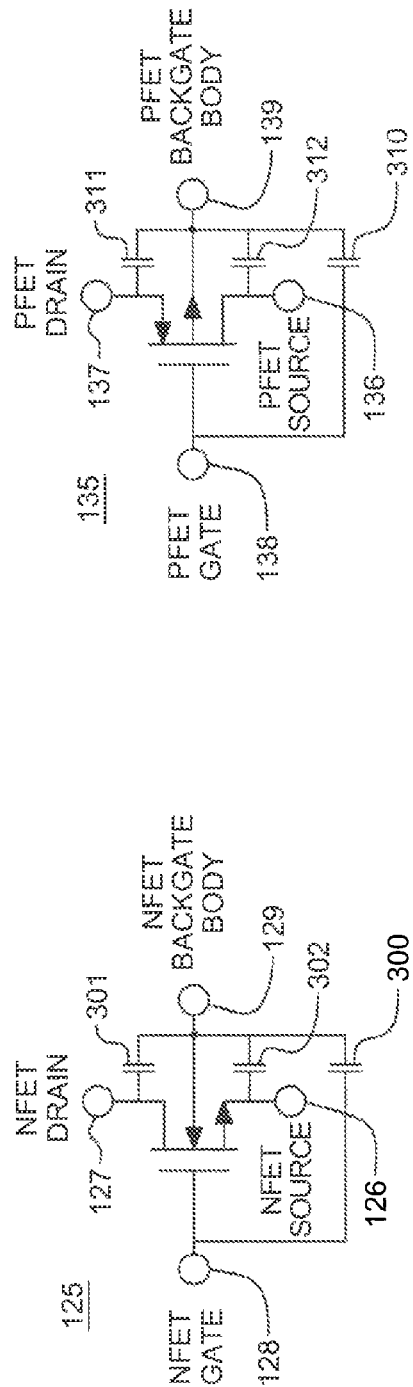
FIG. 3A
FIG. 3B
FIG. 3C

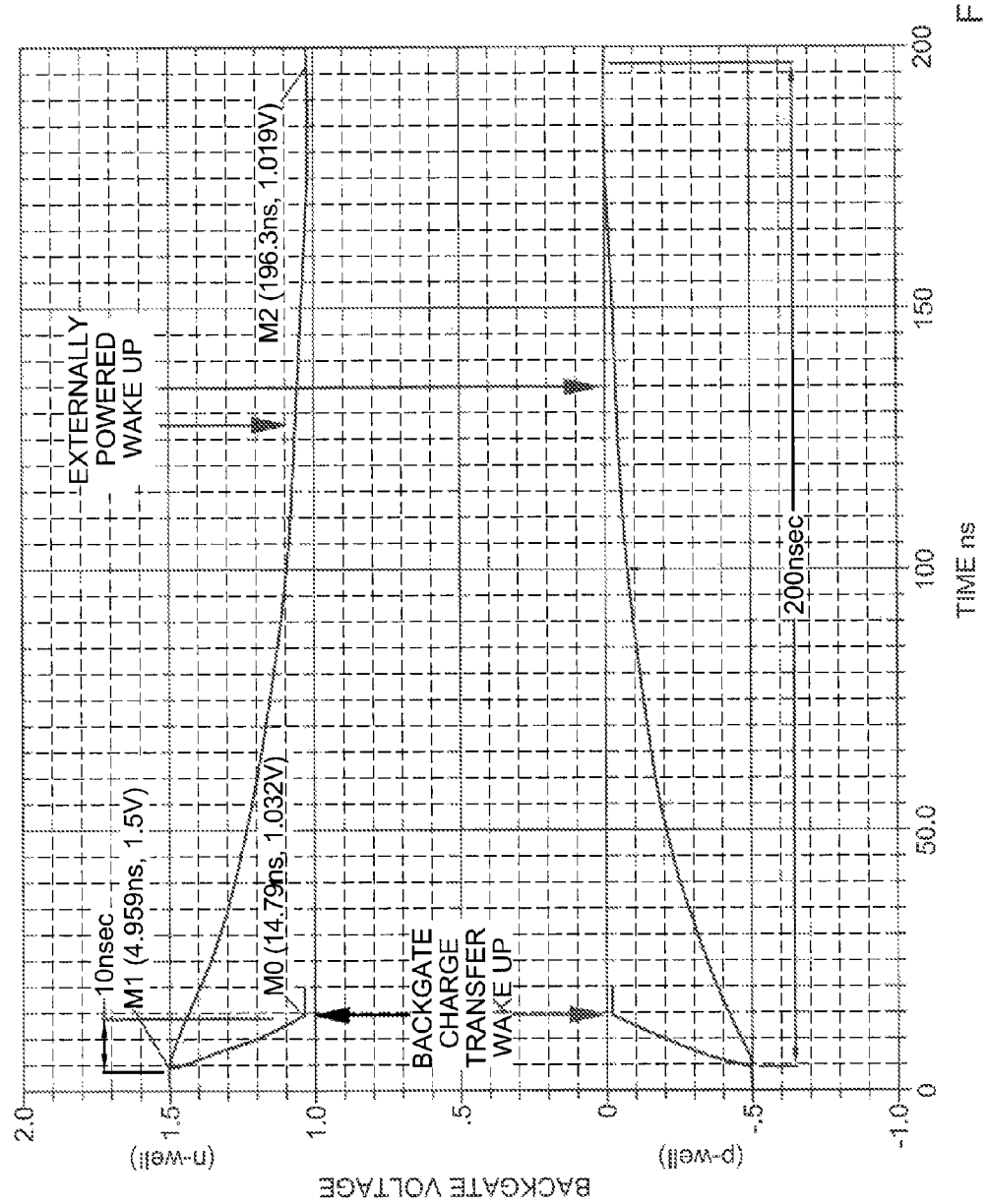

TRANSITIONING DIGITAL INTEGRATED CIRCUIT FROM STANDBY MODE TO ACTIVE MODE VIA BACKGATE CHARGE TRANSFER

CROSS-REFERENCE TO RELATED APPLICATIONS

This application is a divisional application of co-pending U.S. patent application Ser. No. 12/206,124, filed Sep. 8, 2008, entitled "Transitioning Digital Integrated Circuit from Standby Mode to Active Mode Via Backgate Charge Transfer", which published on Mar. 11, 2010, as U.S. Patent Publication No. 2010/0060344 A1; which is now U.S. Pat. No. 7,791,403 published on Sep. 7, 2010, the entirety of which is hereby incorporated herein by reference.

TECHNICAL FIELD

The present invention relates in general to digital integrated circuits, and more particularly, to transitioning a digital integrated circuit, such as a memory circuit, from a backgate biased standby mode to an active mode.

BACKGROUND OF THE INVENTION

Transistors, such as n-channel field effect transistors (NFET) and p-channel field effect transistors (PFET), formed in a complementary-metal-oxide silicon (CMOS) integrated circuit, operate when an input voltage is applied to a gate voltage. This gate voltage establishes an electric field perpendicular to a channel between a source and drain of the transistor. A conductance of the channel is controlled by the electric field. If no gate voltage is applied, a path between the source and drain is formed as two back-to-back p-n junctions, and the drain current is negligible. When a positive voltage is applied to the gate of the transistor, electrons are attracted to the channel. When the gate voltage exceeds a threshold level, an inversion layer is formed in the channel to couple the source and drain. The threshold voltage level of a transistor is dependent on several variables, both controllable and uncontrollable.

In order to save power when not in use, CMOS transistors are typically transitioned to a standby mode to reduce their power consumption. Fast switching (or wake-up) of the transistors from standby mode to active mode is a goal for processing efficiency. External power and high-speed charge circuits are typically implemented to improve switching speed from standby mode to active mode.

SUMMARY OF THE INVENTION

Presented herein is a new approach for quickly and efficiently switching a digital circuit comprising one or more n-channel transistors and one or more p-channel transistors, such as a memory circuit, from backgate biased standby mode to active mode.

In one aspect, a digital circuit is provided which includes a semiconductor substrate, at least one n-channel transistor and at least one p-channel transistor. The at least one n-channel transistor has a gate, a drain and a source disposed at least partially in at least one p-type well in the semiconductor substrate, and the at least one p-channel transistor has a gate, a drain and a source disposed at least partially in at least one n-type well in the semiconductor substrate. The digital circuit further includes a backgate control circuit which is electrically coupled to the at least one p-type well and to the at least one n-type well to, in part, facilitate transitioning the at least one n-channel transistor and the at least one p-channel transistor from standby mode to active mode by shunting charge from the at least one n-type well to the at least one p-type well.

In another aspect, a method of transitioning a digital circuit from a backgate biased standby mode to an active mode is provided. The method includes: shunting charge from at least one n-type well to at least one p-type well in a semiconductor substrate of the digital circuit, the digital circuit comprising at least one p-channel transistor having a gate, a drain, and a source disposed at least partially within the at least one n-type well, at least one n-channel transistor having a gate, a drain and a source disposed at least partially within the at least one p-type well; monitoring a well voltage of at least one well of the at least one n-type well and the at least one p-type well; and discontinuing shunting of charge from the at least one n-type well to the at least one p-type well when the monitored well voltage reaches a defined threshold voltage indicative of a transition of the at least one p-channel transistor or the at least n-channel transistor from backgate biased standby mode to active mode.

In a further aspect, a method of fabricating a digital circuit is provided which includes: obtaining a semiconductor substrate; disposing at least one p-type well in the semiconductor substrate and disposing at least one n-type well in the semiconductor substrate; providing at least one n-channel transistor having a gate, a drain and a source disposed at least partially in the at least one p-type well, and providing at least one p-channel transistor having a gate, a drain and a source disposed at least partially in the at least one n-type well; and providing a backgate control circuit electrically coupled to the at least one p-type well and to the at least one n-type well to facilitate transitioning of the at least one n-channel transistor and the at least one p-channel transistor from standby mode to active mode by shunting charge from the at least one n-type well to the at least one p-type well.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1A is a partial cross-sectional elevational view of one embodiment of a digital circuit comprising one or more n-channel transistors and one or more p-channel transistors to undergo transitioning from a standby mode to an active mode, in accordance with an aspect of the present invention;

FIG. 1B is a schematic depiction of the n-channel field effect transistor (NFET) of FIG. 1A, in accordance with an aspect of the present invention;

FIG. 1C is a schematic depiction of the p-channel field effect transistor (PFET) of FIG. 1A, in accordance with an aspect of the present invention;

FIG. 3A is a cross-sectional elevational view of the digital circuit of FIG. 1A, illustrating viewing of the transistors to backgate bodies as backgate capacitors capable of holding charge, in accordance with an aspect of the present invention;

FIG. 3B is a schematic depiction of the NFET to backgate body capacitors of FIG. 3A, in accordance with an aspect of the present invention;

FIG. 3C is a schematic depiction of the PFET to backgate body capacitors of FIG. 3A, in accordance with an aspect of the present invention;

FIG. 8 is a graph of transition time from standby mode to active mode, employing the externally powered transition approach of FIGS. 4A & 4B compared with the backgate charge transfer approach depicted in FIGS. 5-7, in accordance with an aspect of the present invention.

DETAILED DESCRIPTION OF THE INVENTION

Figure 2:
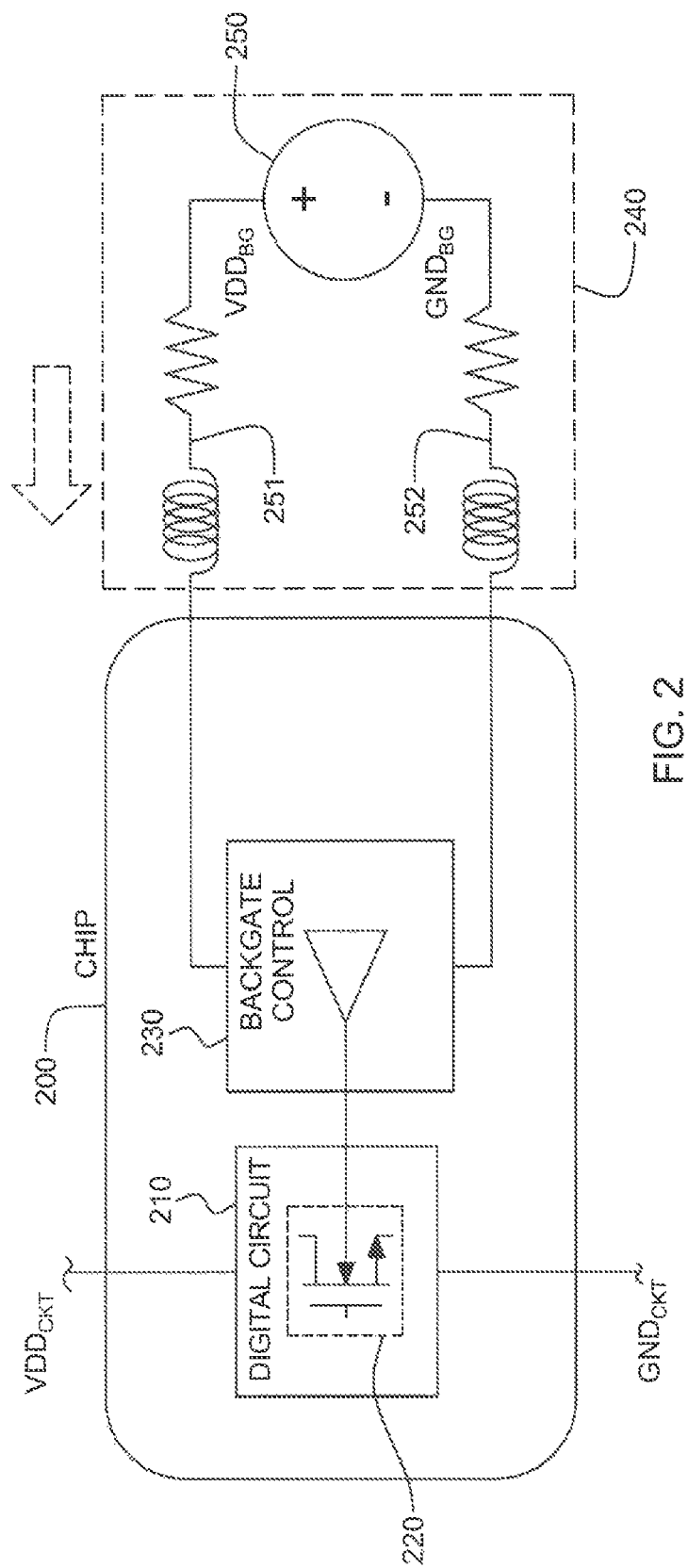
FIG. 2 is a schematic of one embodiment of a digital integrated circuit chip, with a backgate control circuit for controlling backgate voltage within the digital integrated circuit employing an external power source.

In the following detailed description of the invention, reference is made to the accompanying drawings which form a part hereof, and in which are shown, by way of illustration only, specific embodiments of the invention. In the drawings, like numerals describe substantially similar components throughout the several views. These embodiments are illustrated in sufficient detail to enable one skilled in the art to practice the invention. Other embodiments may be utilized and structural, logical and electrical changes may be made without departing from the scope of the present invention.

The present invention relates in general to circuits and methods for enhancing switching speed of, for example, a memory circuit comprising complementary-metal oxide silicon (CMOS) transistors from standby mode to active mode. As used herein, "active mode" means circuit conditions are controlled for a maximum and nominal performance. Nominal power supply voltage is given without backgate biasing, and clock speed is close to the maximum specification. In active mode, an n-well is maintained at the power supply voltage, and a p-well is maintained at ground voltage, without backgate biasing. A "standby mode" or "sleep mode" means circuit conditions are changed for lower power consumption with reduced computing performance. There are different levels of standby mode, include shallow standby and deep standby. Lower than nominal power supply can be given, with backgate biasing applied. Backgate biasing is one lower power operation technique. In standby mode, clock speed is lower than the maximum specification, and may be close to zero, or zero itself. For backgate biasing, the n-well voltage is higher than the power supply voltage, and the p-well voltage is lower than the ground voltage. "Backgate biased standby mode" means a mode with reduced leakage power consumption and clock speed (and performance) using backgate voltage control. The power supply voltage could be the same or lower than in the active mode, and backgate voltages are applied. Clock speed is lower, as is leakage current and performance. The backgate biased standby mode (or backgate biased sleep mode) can be considered a shallow standby mode, so that it can be achieved quickly. A deeper standby mode could be obtained by powering down all digital circuits in the domain. This would be an extreme technique for saving power, and would result in longer time to wake up the digital circuits.

Conventionally, a CMOS digital circuit (for example, fabricated via a triple-well CMOS process) comprises both n-channel field effect transistors (NFETs) and p-channel filed effect transistors (PFETs), either of which may be placed in standby or sleep mode in a bulk CMOS digital circuit employing a backgate bias. The backgate refers to the p-type well (or n-type well) within which the NFETs (or p-channel field effect transistors (PFETs)) are formed. Fast transitioning of the CMOS digital circuit from backgate biased standby to active mode is a significant issue. As described further below, in one approach, high speed charge transfer circuits may be implemented to enhance the transition speed from standby to active mode.

FIGS. 1A-1C depict one example of a digital integrated circuit, generally denoted 100, to undergo transition from standby mode to active mode, in accordance with an aspect of the present invention. Referring collectively to the figures, digital circuit 100 includes a semiconductor substrate 110 with a p-type well (or p-well) and an n-type well (or n-well) formed therein from a surface 111 of semiconductor substrate 110. As illustrated, p-type well 120 accommodates one or more n-channel transistors 125, each comprising a source 126, a drain 127, and a gate stack 128. Additionally, a backgate body contact 129 is formed in p-well 120 to facilitate electrical contact to that backgate body. Similarly, n-type well 130 accommodates one or more p-channel transistors 135, each comprising a source 136, a drain 137 and a gate 138 disposed at least partially within the n-type well. Further, electrical contact is made to n-well 130 via a backgate body contact 139. FIGS. 1B & 1C schematically illustrate the transistor structures of FIG. 1A.

FIG. 2 illustrates one approach for transitioning a digital integrated circuit from standby mode to active mode. In FIG. 2, digital circuit 210 resides within an integrated circuit chip 200, and comprises one or more transistors 220. In one embodiment, transistors 220 comprise a plurality of n-channel transistors configured to implement, for example, a memory circuit such as a static random access memory (SRAM). Digital circuit 210 is electrically connected between a circuit power source $VDD_{ckt}$ and ground $GND_{ckt}$. A backgate control circuit 230 is provided within integrated circuit chip 200 for monitoring and controlling of the backgate voltage within the p-wells and n-wells of digital circuit 210.

Backgate control circuit 230 operates to adjust the voltage level within the wells, for example, to adjust the power consumption (and device speed) of the transistors, and thus, the power consumption of the digital circuit. When the backgate control circuit 230 is to change the backgate voltage very fast, a large current may be employed from a source external to integrated circuit chip 200. This large current is supplied (in one example) by external power circuit 240, which includes a backgate power source 250 that comprises backgate voltage supply $VDD_{BG}$ and backgate ground $GND_{BG}$. Power source 250 is electrically coupled to backgate control circuit 230 via appropriate wiring 251, 252. Due to the size of the charge being transferred from external power circuit 240 to backgate control circuit 230, and subsequently to the backgate bodies, wiring parasitics within wiring 251 and 252 may cause the power transfer to be restricted, thus limiting the transition speed of the digital circuit 210 from, for example, standby mode to active mode.

The bodies of the backgates (i.e., the p-type wells and the n-type wells) within the semiconductor substrate may be viewed as forming backgate capacitors with the transistors. For example, referring collectively to FIGS. 3A-3C, a capacitor 300 is formed between p-well 120 and NFET source 126 of NFET 125, a capacitor 301 is formed between NFET drain 127 and p-well 120, and a capacitor 302 is formed between gate NFET 128 and p-well 120. These backgate capacitors are schematically illustrated in FIG. 3B as separate capacitors, but may also be viewed at the digital circuit level as a single collective capacitance. Similarly, a capacitor 310 forms between n-well 130 and PFET source 136, a capacitor 311 exists between n-well 130 and PFET drain 137, and a capacitor 312 resides between n-well 130 and PFET gate 138 of PFET 135 of digital circuit 100. In one embodiment, digital circuit 100 comprises a plurality of NFETs and a plurality of PFETs respectively disposed in one or more p-wells and n-wells within semiconductor substrate 110. As noted above, electrical connection to p-well 120 is via an NFET backgate body contact 129 and electrical connection to n-well 130 is via a PFET backgate body connection 139.

Figure 4B:
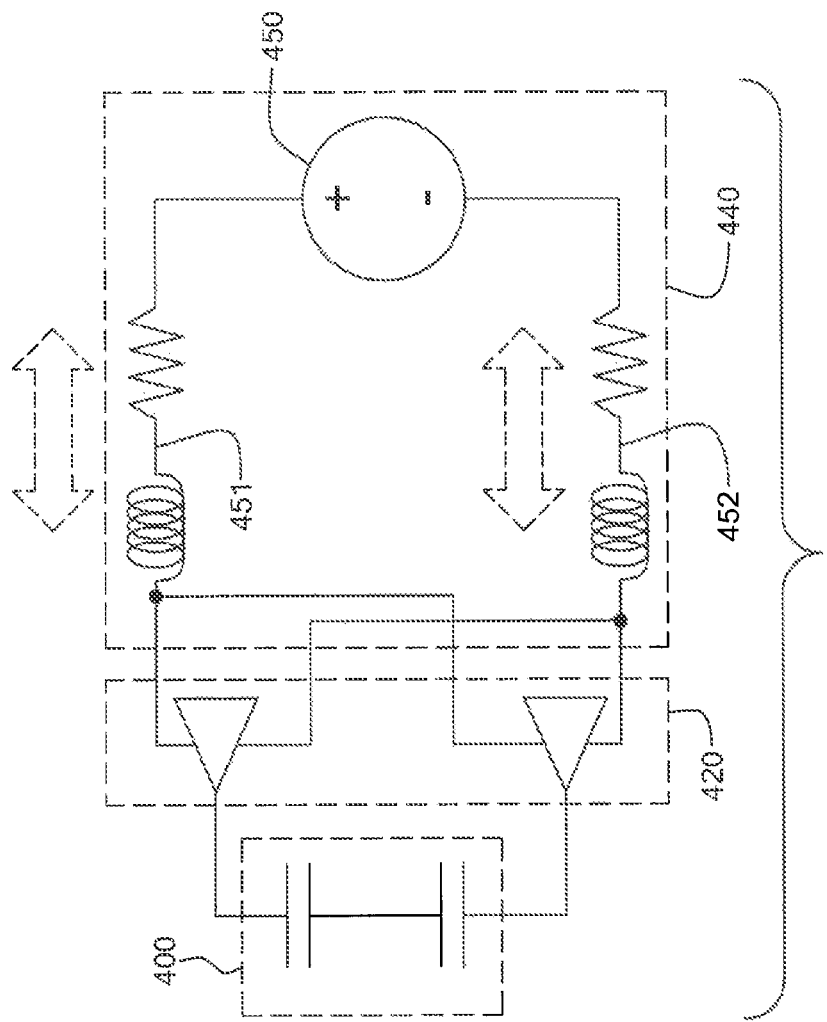
FIG. 4B is a more detailed depiction of the digital circuit and backgate control circuit embodiment of FIG. 4A, wherein a power source external to the digital circuit is employed to provide the large current required (in one embodiment) for a fast backgate voltage transition to achieve a fast digital circuit transition from standby to active mode.
Figure 4A:
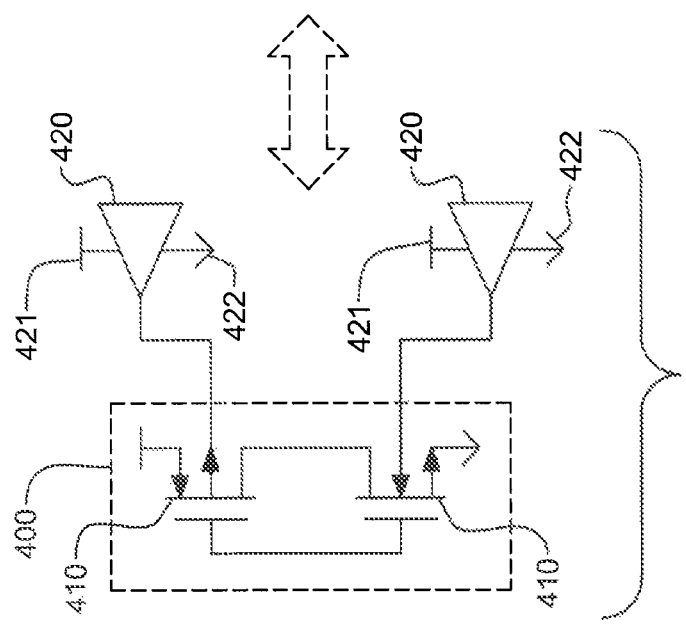
FIG. 4A is a schematic of one embodiment of a digital circuit and backgate control circuit for facilitating transitioning of transistors of the digital circuit from standby mode to active mode.

In FIGS. 4A & 4B, a digital circuit 400 is illustrated. Digital circuit 400 comprises multiple PFET and NFET transistors 410, which may include one or more n-channel transistors and one or more p-channel transistors. A backgate control circuit 420, comprising a PFET backgate control and an NFET backgate control, is coupled to each backgate body, that is, to the p-wells and n-wells within which the n-channel and p-channel transistors are formed (as described above). Backgate control circuit 420 is coupled between a power supply 421 and ground 422.

In the more detailed embodiment of FIG. 4B, the transistors of digital circuit 400 are depicted as backgate capacitances to be transitioned from standby to active mode levels. Backgate control circuit 420 controls the transitioning process. In order to achieve fast backgate transition of the digital circuit, a large current (for example, 1-10 amps) may be required instantaneously (i.e., in a very short time period in the order of nano-seconds) from an external power circuit 440, which includes a power supply 450 and wiring 451, 452 coupling the power supply to backgate control circuit 420. As noted above, parasitics within wiring 451, 452 can create a bottleneck which limits the amount of surge current supplied through the power lines to the backgate control circuit 420 for transitioning the backgate voltages of the digital circuit. Providing a decoupling capacitor and wider power lines can be used to mitigate these parasitics, but a bottleneck still remains in the wiring employed to transfer the charge from the external power source into the digital circuit.

Figure 5:
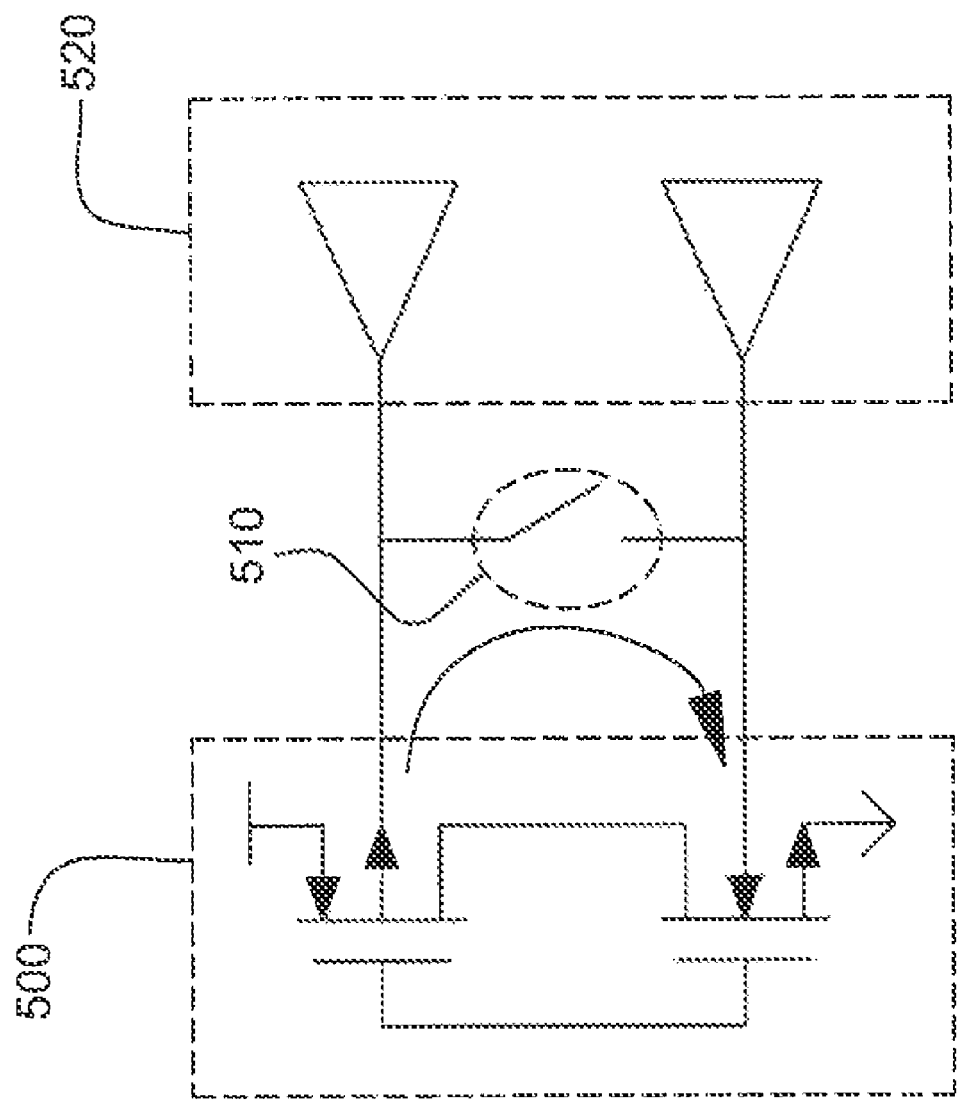
FIG. 5 is a schematic of an alternate embodiment of a digital circuit with a backgate control circuit, in accordance with an aspect of the present invention.

FIG. 5 illustrates an alternative approach to transitioning the digital circuit from standby mode to active mode. In accordance with this approach, both NFETs and PFETs are employed within the digital circuit, and are simultaneously transitioned from backgate biased standby mode to active mode. This can be achieve by using the PFET backgate charges in the n-wells to raise the NFET backgate voltage during the transition from standby to active mode, and the NFET backgate charges can be employed to lower the PFET backgate voltage during the transition. Thus, transition occurs in this embodiment without the need for any external power, which results in a faster transition. Note that a one-to-one correspondence between the number of NFETs and the number of PFETs is not necessary to implementation of this invention, and is one example only. The n-wells or PFET backgates are assumed to be electrically connected via the backgate control circuit, and the p-wells or NFET backgates are assumed to be electrically connected via the backgate control circuit. As a result, the n-wells and p-wells may each be collectively viewed as a large capacitance (as explained above).

FIG. 5 illustrates a digital circuit 500 comprising one or more n-channel transistors and one or more p-channel transistors, and a backgate control circuit 520. Additionally, a shunt switch 510 is depicted for selectively shunting charge from the n-wells of the p-channel transistors to the p-wells of the n-channel transistors during switching from standby to active mode. As a specific example, in backgate biased standby mode the n-type wells might be at 1.5 volts and the p-type wells at −0.5 volts. Thus, to transition from backgate biased standby to active mode, charge is transferred from the n-wells the p-wells until, for example, the n-wells are at 1.0 volts and the p-wells are at 0 volts, which returns both the p-channel transistors and the n-channel transistors to active mode.

Figure 6:
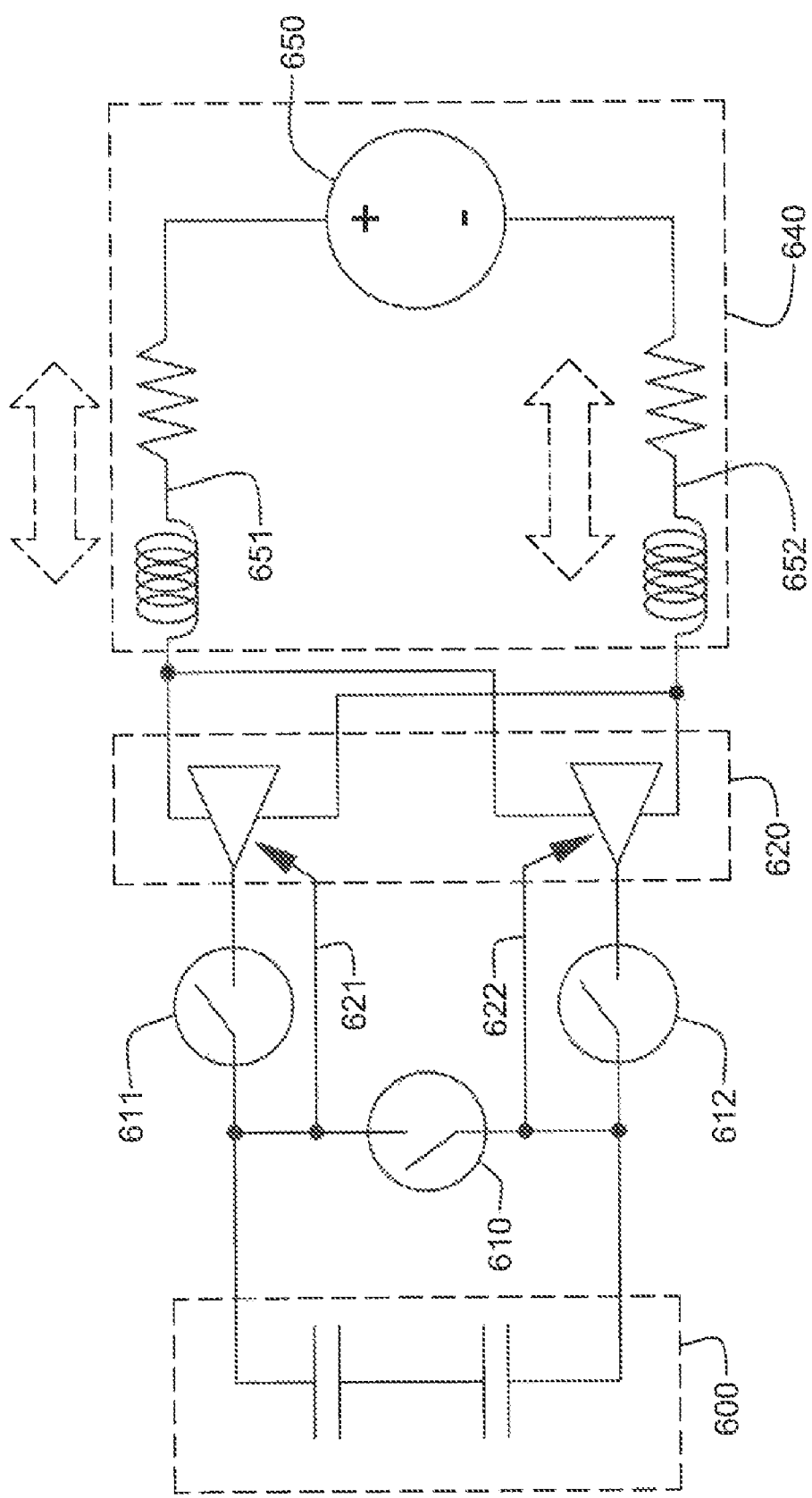
FIG. 6 is a more detailed embodiment of a digital circuit with a backgate control circuit, in accordance with an aspect of the present invention.

FIG. 6 illustrates a more detailed embodiment of an integrated circuit comprising a digital circuit 600 and a backgate control circuit 620. In this embodiment, a shunt switch 610 is again provided for selectively shunting charge from, for example, the n-wells to the p-wells associated with one or more p-channel transistors and one or more n-channel transistors, respectively, of the digital circuit during transitioning of the digital circuit from backgate biased standby mode to active mode. In one example, digital circuit 600 comprises a memory circuit with a plurality of n-channel transistors disposed in one or more p-wells and a plurality of p-channel transistors disposed in one or more n-wells. As described above, the p-wells are electrically interconnected by the backgate control circuit and the n-wells are electrically interconnected by the backgate control circuit such that each may be viewed as a single large capacitance. Also provided are a first control switch 611 and a second control switch 612 which electrically connect the respective backgate control circuit 620 to the p-wells and n-wells. In one embodiment, backgate control circuit includes one or more PFET backgate controllers and one or more NFET backgate controllers. Also illustrated is an external power source 640 which includes a power supply 650 and wiring 651, 652 connecting power supply 650 to backgate control circuit 620. When first control switch 611 and second control switch 612 are closed, backgate control circuit 620 provides a fine level of voltage control to the backgate bodies employing, for example, the external power source 640.

The external power source 640 may also be employed, for example, when placing digital circuit 600 into a backgate biased standby or sleep mode. However, as illustrated in FIG. 7, the external power source is not employed when transitioning from backgate biased standby mode to active mode, in accordance with an aspect of the present invention.

Figure 7:
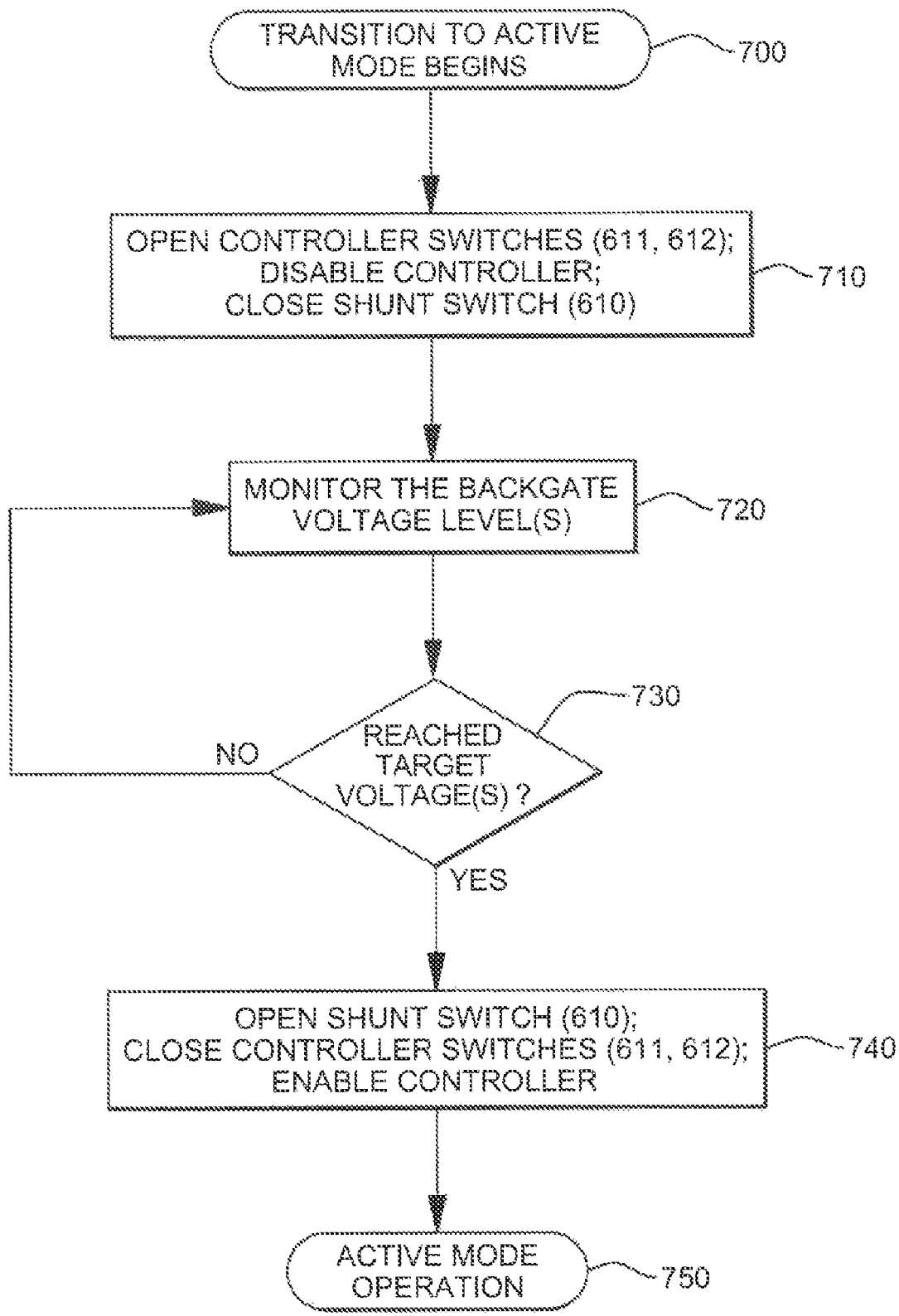
FIG. 7 is a flowchart of one embodiment of processing for transitioning transistors of a digital circuit from backgate biased standby mode to active mode, in accordance with an aspect of the present invention.

Referring to FIG. 7, in one embodiment, digital circuit transition to active mode begins 700 with opening the control switches (611,612 of FIG. 6) of the backgate control circuit, thereby disconnecting the external power source, and closing the shunt switch (610 of FIG. 6), which causes charge to be transferred from the n-well(s) to the p-well(s) within the digital circuit. The backgate control circuit monitors the n-well voltage and/or the p-well voltage 720 and determines whether a threshold voltage has been reached 730. If "no", then the backgate control circuit continues to monitor the backgate voltage level(s). Once one or more well voltages reaches a predefined threshold voltage level, then the backgate control circuit opens the shunt switch and closes the controller switches, enabling the backgate control circuit to again directly control the supply of power to the backgates, which completes transition of the transistors of the digital circuit to active mode operation 750.

As noted above, as one example, in standby mode the n-wells may be at a 1.5 voltage level, and the p-wells at a −0.5 voltage level. Thus, wake-up is achieved by shunting charge from the n-wells to the p-wells via the shunt switch until, for example, the n-wells reach a threshold voltage level of 1.0 volts and/or the p-wells reach a threshold voltage level of 0.0 volts.

FIG. 8 is a graph comparing an externally powered wake-up approach and a wake-up approach employing backgate charge transfer such as described herein. As illustrated, using backgate charge transfer the n-wells and p-wells attain the desired threshold level in approximately 1/20 the time required for transitioning the backgates using the externally powered wake-up approach, wherein current kickback and supply resistance limit the speed of the voltage transition. Further, using an external power source to effectuate the transition can cause local voltage bounces due to kickback, which can contaminate memory integrity and damage devices with voltage spikes. The backgate charge transfer approach described herein advantageously eliminates these problems.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of fabricating a digital circuit comprising:
   obtaining a semiconductor substrate;
   disposing at least one p-type well in the semiconductor substrate and disposing at least one n-type well in the semiconductor substrate;
   providing at least one n-channel transistor having a gate, a drain and a source disposed at least partially in the at least one p-type well, and providing at least one p-channel transistor having a gate, a drain and a source disposed at least partially in the at least one n-type well; and
   providing a backgate control circuit electrically coupled to the at least one p-type well and to the at least one n-type well via a first control switch and a second control switch; and
   providing a shunt switch electrically connected between the at least one n-type well and the at least one p-type well, the backgate control circuit being coupled to the shunt switch for closing the shunt switch when facilitating transitioning of the at least one n-channel transistor and the at least one p-channel transistor from standby mode to active mode, resulting in shunting of charge from the at least one n-type well to the at least one p-type well, and for opening the shunt switch when a well voltage of the at least one n-type well or the at least one p-type well reaches a threshold voltage indicative of a transition of the at least one p-channel transistor or the at least one n-channel transistor to active mode, wherein subsequent to reaching active mode, and opening the shunt switch, the backgate control circuit closes at least one of the first control switch or the second control switch to actively maintain during active mode at least one of voltage of the p-type well at a first voltage level or voltage of the n-type well at a second voltage level, wherein the first voltage level and the second voltage level are different active mode voltage levels.

2. The method of claim 1, wherein the at least one backgate control circuit simultaneously transitions the at least one n-channel transistor and the at least one p-channel transistor from standby mode to active mode without draining charge from the at least one n-type well to a charge sink external to the digital circuit and without raising charge in the at least one p-type well from a charge source external to the digital circuit.

3. The method of claim 1, wherein providing the backgate control circuit further comprises providing at least one voltage sensor coupled to at least one well of the at least one p-type well and the at least one n-type well for monitoring well voltage thereof, and wherein the backgate control circuit is configured to discontinue shunting of charge from the at least one n-type well to the at least one p-type well when the well voltage reaches a threshold voltage indicative of at least one of the at least one n-channel transistor or the at least one p-channel transistor having transitioned to active mode.

4. The method of claim 3, wherein the well voltage being monitored is the well voltage of the at least one n-type well, and the threshold voltage indicates a transition of the at least one p-channel transistor to active mode, and wherein the backgate control circuit discontinues shunting of charge from the at least one n-type well to the at least one p-type well when the well voltage of the at least one n-type well drops to the threshold voltage.

5. The method of claim 3, wherein the well voltage being monitored is the well voltage of the at least one p-type well, and the threshold voltage indicates a transition of the at least one n-channel transistor to active mode, and wherein the backgate control circuit discontinues shunting of charge from the at least one n-type well to the at least one p-type well when the well voltage of the at least one p-type well rises to the threshold voltage.

6. The method of claim 1, wherein the backgate control circuit discontinues the shunting of charge by opening the shunt switch before voltage of the at least one n-type well equals voltage of the at least one p-type well when transitioning from standby mode to active mode.

7. The method of claim 1, wherein the digital circuit is a static random access memory circuit.

8. The method of claim 1, further comprising disposing multiple p-type wells in the semiconductor substrate, and disposing multiple n-type wells in the semiconductor substrate, and providing multiple n-channel transistors disposed at least partially in the multiple p-type wells, and providing multiple p-channel transistors disposed at least partially in the multiple n-type wells, and wherein providing the backgate control circuit comprises providing the backgate control circuit to facilitate simultaneous transitioning of the multiple n-channel transistors and the multiple p-channel transistors from standby mode to active mode by shunting charge from the multiple n-type wells to the multiple p-type wells without coupling the multiple p-type wells or the multiple n-type wells to a power source, and wherein the standby mode is a backgate biased standby mode of the digital circuit and transition to active mode is accomplished using charge stored within the digital circuit.

* * * * *